(12) United States Patent
Murillo et al.

(10) Patent No.: US 12,162,245 B2
(45) Date of Patent: Dec. 10, 2024

(54) RESIN FILM

(71) Applicants: Airbus Operations SAS, Toulouse (FR); Airbus Operations S.L., Getafe (ES)

(72) Inventors: Richard Murillo, Toulouse (FR); Matilde De La Mota Mendiola, Getafe (ES); Nathan Lagache, Toulouse (FR)

(73) Assignees: Airbus Operations SAS, Toulouse (FR); Airbus Operations S.L., Getafe (ES)

( * ) Notice: Subject to any disclaimer, the term of this patent is extended or adjusted under 35 U.S.C. 154(b) by 0 days.

(21) Appl. No.: 18/489,143

(22) Filed: Oct. 18, 2023

(65) Prior Publication Data

US 2024/0131820 A1 Apr. 25, 2024
US 2024/0227360 A9 Jul. 11, 2024

(30) Foreign Application Priority Data

Oct. 20, 2022 (FR) ...................................... 2210869

(51) Int. Cl.
*B32B 3/10* (2006.01)
*B32B 3/08* (2006.01)
(Continued)

(52) U.S. Cl.
CPC ............ *B32B 15/092* (2013.01); *B32B 3/08* (2013.01); *B32B 5/02* (2013.01); *B32B 15/14* (2013.01); *B32B 27/12* (2013.01); *B32B 27/38* (2013.01); *B32B 37/182* (2013.01); *B32B 38/0004* (2013.01); *B64C 1/12* (2013.01); *B64F 5/10* (2017.01); *H01B 5/16* (2013.01); *B32B 2260/021* (2013.01); *B32B 2260/046* (2013.01);

(Continued)

(58) Field of Classification Search
CPC ........................................................ B32B 3/10
See application file for complete search history.

(56) References Cited

U.S. PATENT DOCUMENTS 4,506,004 A 3/1985 Sullivan
6,165,595 A 12/2000 Kumagai et al.
(Continued)

FOREIGN PATENT DOCUMENTS

FR 3002206 A1 8/2014
WO 9738562 A1 10/1997

OTHER PUBLICATIONS

French Search Report for corresponding French Patent Application No. 2210869 dated May 31, 2023; priority document.

*Primary Examiner* — Elizabeth E Mulvaney
(74) *Attorney, Agent, or Firm* — Greer, Burns & Crain, Ltd.

(57) ABSTRACT

A resin film configured to hold a conductive metallic track against a panel. The resin film partially covers the conductive metallic track, such that the conductive metallic track has at least one region which does not have the resin film, so as to allow an electrical connection by contact. Thus, in the context of assembly on a panel, the metallic track incorporated between the panel and the resin film is protected, thus rendering this technical solution particularly robust. Furthermore, the resin film electrically insulates the metallic track from surrounding elements, and the regions which do not have resin film allow an electrical connection by contact.

10 Claims, 3 Drawing Sheets

(51) Int. Cl.
  *B32B 5/02* (2006.01)
  *B32B 15/092* (2006.01)
  *B32B 15/14* (2006.01)
  *B32B 27/12* (2006.01)
  *B32B 27/38* (2006.01)
  *B32B 37/18* (2006.01)
  *B32B 38/00* (2006.01)
  *B64C 1/12* (2006.01)
  *B64F 5/10* (2017.01)
  *H01B 5/16* (2006.01)

(52) U.S. Cl.
  CPC ... *B32B 2262/106* (2013.01); *B32B 2307/202* (2013.01); *B32B 2307/206* (2013.01); *B32B 2605/18* (2013.01)

(56) References Cited

U.S. PATENT DOCUMENTS

| | | | | |
|---|---|---|---|---|
| 2005/0167830 A1* | 8/2005 | Chang | .................. | H05K 3/4007 257/737 |
| 2014/0154496 A1* | 6/2014 | Sang | ........................ | B32B 5/26 156/196 |
| 2017/0254065 A1* | 9/2017 | Hegenbart | ............ | B29C 64/106 |

* cited by examiner

RESIN FILM

CROSS-REFERENCES TO RELATED APPLICATIONS

This application claims the benefit of the French patent application No. 2210869 filed on Oct. 20, 2022, the entire disclosures of which are incorporated herein by way of reference.

FIELD OF THE INVENTION

The invention relates to the field of incorporating a conductive metallic track on a panel.

BACKGROUND OF THE INVENTION

In a known manner, the circulation of electrical current in a vehicle is ensured by electrical wires or cables, by the structure itself if the latter is sufficiently conductive (e.g., metallic structure), or by an assembly of metallic elements which are bolted to the panels of the structure if the latter is not sufficiently conductive (e.g., if the structure is made of composite materials based on carbon fibers or glass fibers). These elements make it possible to power different components of the vehicle, to circulate signals, to drain short-circuit current, or to provide aircraft lightning protection.

Usually, these different conductive elements are installed within the structure of a vehicle during the final assembly of the vehicle or during the assembly of sub-assemblies. Consequently, the duration of this installation influences the production rate associated with a vehicle assembly line.

Thus, in this context, it is desirable for the conductive elements to be incorporated even within elements of the structure, during the manufacture thereof.

SUMMARY OF THE INVENTION

To this end, according to a first aspect, what is proposed is a resin film designed to hold a conductive metallic track against a panel. The resin film partially covers the conductive metallic track, such that the conductive metallic track has at least one region which does not have the resin film, so as to allow an electrical connection by contact.

Thus, in the context of assembly on a panel, the metallic track incorporated between the panel and the resin film is protected, thus rendering this technical solution particularly robust. Furthermore, in a particularly clever manner, the resin film electrically insulates the metallic track from surrounding elements, and the regions which do not have resin film allow an electrical connection by contact.

According to another aspect, what is proposed is an aircraft comprising at least one structural panel of an aircraft comprising a conductive metallic track positioned against a face of the structural panel. The aircraft comprises a resin film partially covering the conductive metallic track and the face of the structural panel so as to hold the conductive metallic track against the structural panel, the conductive metallic track having at least one region which does not have the resin film so as to allow an electrical connection by contact.

According to a particular provision, the structural panel is made of composite material.

According to another aspect, what is proposed is a method for assembling a structural panel of an aircraft. The method comprises at least the following steps:

cutting a conductive metallic track from a plate made of conductive metallic material;

applying a resin film against the conductive metallic track to partially cover the conductive metallic track, so as to leave at least one region which does not have resin film; and positioning the conductive metallic track and the resin film against a face of the structural panel, such that the resin film at least partially covers the face of the structural panel so as to hold the metallic track against the structural panel.

Thus, the proposed method allows a structural panel comprising a conductive metallic track to be assembled in a simple manner. The application of the resin film allows the metallic track to be assembled on the structural panel while ensuring the electrical insulation of the metallic track with respect to surrounding elements. Furthermore, the regions left without resin film make it possible to be able to effect an electrical connection by contact on these regions in a simple manner.

According to a particular provision, the method comprises the following step:

masking at least one region of the conductive metallic track with a masking strip covering each predetermined region, and wherein the resin film is applied to the conductive metallic track and to each masking strip.

According to a particular provision, the method comprises the following step:

removing each masking strip covered with the resin film, after the resin film and the metallic track have been positioned.

According to a particular provision, the resin film is applied with a wet peel ply.

According to a particular provision, the resin film and the metallic track are positioned in the following manner:

positioning the wet peel ply with the conductive metallic track on the face of the structural panel;

heating the structural panel, the conductive metallic track and the wet peel ply so as to thermally bond the resin film to the conductive metallic track and the face of the structural panel;

removing the wet peel ply so as to retain the thermally bonded resin film on the conductive metallic track and the face of the structural panel.

According to a particular provision, the structural panel is made of composite material and the heating of the structural panel cures the composite material of the structural panel.

According to another aspect, what is proposed is a method for assembling an aircraft comprising a phase of assembling several structural panels, comprising the following step:

electrically connecting by contact each region of the structural panels, so as to form an electricity circulation network.

BRIEF DESCRIPTION OF THE DRAWINGS

The features of the invention that are mentioned above, and others, will become more clearly apparent from reading the following description of at least one exemplary embodiment, the description being given in relation to the appended drawings, in which.

DETAILED DESCRIPTION OF THE PREFERRED EMBODIMENTS

Resin Film

Figure 1:
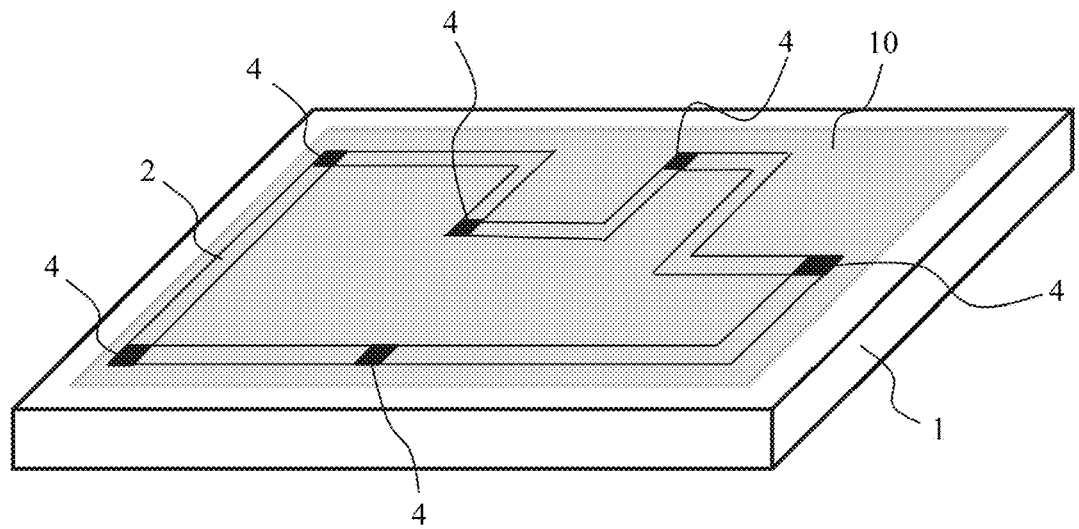
FIG. 1 schematically illustrates one step of a method for assembling a structural panel of an aircraft comprising a conductive metallic track positioned against a face of the structural panel.

What is proposed is a resin film 6 partially covering a conductive metallic track 2 which will be described below. The resin film 6 partially covers the conductive metallic track 2, such that the conductive metallic track 2 has at least one region 8 which does not have the resin film 6 so as to allow an electrical connection by contact. As will be described below, the resin film 6 is designed to hold the conductive metallic track 2 against a panel 1.

It is specified that partially covering is understood to mean that the resin film 6 covers the metallic track 2 with the exception of certain regions 8 which are left without resin film 6. In other words, certain predetermined regions 8 of the metallic track 2 are not covered by the resin film 6. As will be described below, the regions 8 which are left without resin film 6 allow an electrical connection by contact with another conductive element. In other words, the resin film 6 is electrically insulating. Thus, a portion of the metallic track 2 which is positioned against a face of the structural panel 1 and which is covered with the resin film 6 is electrically insulated. The regions 8 which are left without resin film 6 are not electrically insulated and allow an electrical connection by contact on the region 8 left without the resin film 6. In addition, according to a particular embodiment, the resin film 6 is designed to protect the metallic track 2 from corrosion and potential shocks.

According to a particular provision, the resin film 6 is an epoxy resin film having a thickness of between 15 μm and 30 μm.

According to another particular provision, the resin film 6 is an epoxy resin film having a thickness of between 30 μm and 150 μm.

Structural Panel

With reference to FIG. 1, what is proposed is a structural panel 1 of an aircraft comprising a conductive metallic track 2. According to a particular provision, the structural panel 1 may be made of composite material. Typically, the composite material comprises fibers and a resin. The fibers may, for example, be glass, carbon or aramid fibers. According to one embodiment, the fibers are pre-impregnated with polymer resin. According to another embodiment, the fibers are in the form of plies which have to be impregnated with polymer resins in order to constitute the structural panel 1. The structural panel 1 can typically cover an area of several square meters. In other words, according to one exemplary embodiment, the structural panel 1 may have length and width dimensions of several meters each.

According to a particular provision, the conductive metallic track 2 is positioned against a face of the structural panel 1. The conductive metallic track 2 may, for example, be a rigid copper track. The metallic track 2 is dimensioned to allow the conduction and the circulation of an electrical current. According to one embodiment, the metallic track 2 may have a thickness of the order of 8 μm to 200 μm. According to another embodiment, the metallic track 2 may have a thickness of several millimeters. It is specified that the thickness of the metallic track 2 is adapted to the type of electrical current that has to circulate through it.

Furthermore, the structural panel 1 comprises a resin film 6, as described above, which partially covers the conductive metallic track 2 and the face of the structural panel 1 so as to hold the conductive metallic track 2 against the structural panel 1.

Aircraft

Figure 5:
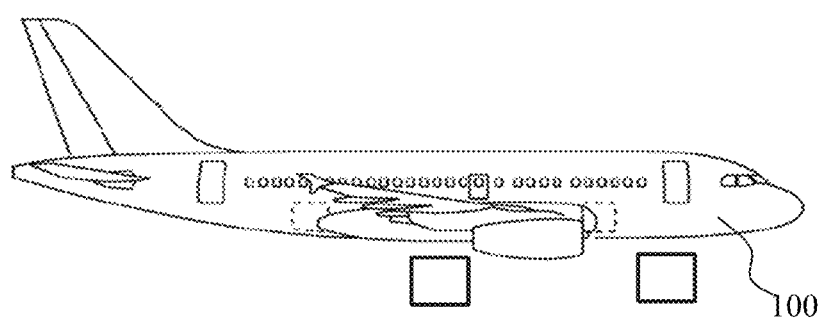
FIG. 5 schematically illustrates an aircraft comprising at least one structural panel comprising a conductive metallic track positioned against a face of the structural assembly panel.
Figure 6:
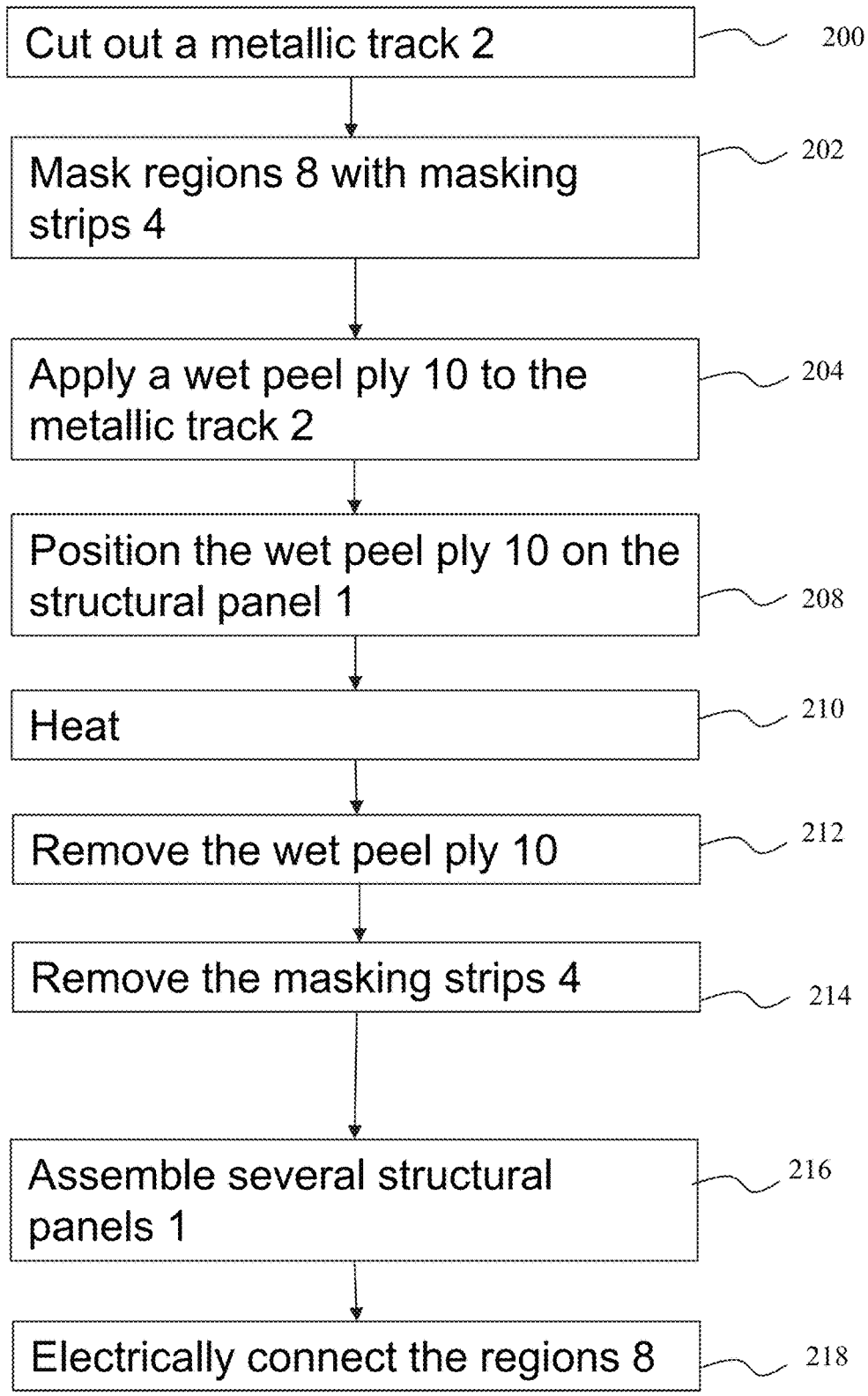
FIG. 6 schematically illustrates the execution of the method for assembling the structural panel.

According to another aspect, as illustrated in FIG. 5, what is proposed is an aircraft 100 comprising at least one exemplar of the structural panel 1. Typically, the aircraft 100 comprises several assembled structural panels 1 forming the fuselage or a portion of the fuselage of the aircraft 100.

In a particular embodiment, the conductive metallic tracks 2 of each structural panel 1 are connected so as to form a network of conductive metallic tracks 2. The network of conductive metallic tracks 2 may have multiple functions such as circulating electricity between different components of the aircraft 100, electrically powering equipment for transmitting electrical signals, draining short-circuit currents or ensuring protection against lightning currents by forming a structure of the Faraday cage type.

Assembly Method

According to another aspect, what is proposed is a method for assembling the structural panel 1.

Intermediate results of the steps of the method are depicted in FIGS. 1 to 4, and FIG. 6 is a block diagram of the progress of the method, according to a particular provision.

The method primarily comprises the following steps:
providing a structural panel 1 for the aircraft 100;
cutting (step 200) a conductive metallic track 2 from a plate made of conductive metallic material;
applying (step 204) a resin film 6 against the conductive metallic track 2 to partially cover the conductive metallic track 2, so as to leave at least one region 8 which does not have resin film 6; and
positioning (step 208) the conductive metallic track 2 and the resin film 6 against a face of the structural panel 1, such that the resin film 6 at least partially covers the face of the structural panel 1 so as to hold the metallic track 2 against the structural panel 1.

According to a particular embodiment, the structural panel 1 provided may be made of pre-impregnated material (such as carbon fiber). According to another embodiment, the structural panel 1 may be made of composite material having fibrous plies (such as carbon fiber plies) which have to be impregnated with a resin and polymerized in order to form the structural panel 1. According to these two embodiments, the structural panel 1 provided may be in the course of lay-up or already be polymerized.

According to a particular provision, the method comprises a step of masking (step 202) at least one predetermined region 8 of the conductive metallic track 2 with a masking strip 4 covering the, or each, region 8. According to a particular provision, the masking strip 4 is a polyester strip designed to withstand a polymerization temperature of the resin film 6.

This masking step (step 202) is carried out prior to the step of applying (step 204) the resin film 6 to the metallic track 2. As will be described in detail below, the application of a masking strip 4 (masking step 202) to predetermined regions 8 of the metallic track 2 then makes it possible to obtain regions 8 which do not have the resin film 6, that is to say, which do not have any insulator. According to this particular provision, after the masking (step 202), the resin 6 is applied to the conductive metallic track 2 having regions 8 which are masked with the masking strip 4. Then, the resin film 6 and the conductive metallic track 2 having regions 8 which are masked with the masking strip 4 are positioned on the structural panel 1. It is specified that the resin film 6 facilitates the manipulation of the metallic track 2. Thus, in the case of a metallic track 2 with a thickness of several micrometers and/or having a complex cut, while being several meters in length, the resin film 6 makes it possible to easily manipulate the metallic track 2 so as to position it on the structural panel 1.

It is specified that, according to a particular provision, the resin film 6 may be applied (step 204) with the aid of a wet peel ply 10. A wet peel ply 10 is understood to mean a ply made of fabric or cellulose coated with the uncured resin film 6. The use of a wet peel ply 10 is a particularly advantageous technical provision which facilitates the transport and the manipulation of the resin film 6 and of the metallic track 2 bonded to the resin film 6.

It is specified that, according to another embodiment, the resin film 6 is applied without a wet peel ply 10. Preferably, when the resin film 6 is applied without a wet peel ply 10, the resin film has a thickness of between 30 µm and 150 µm.

Figure 2:
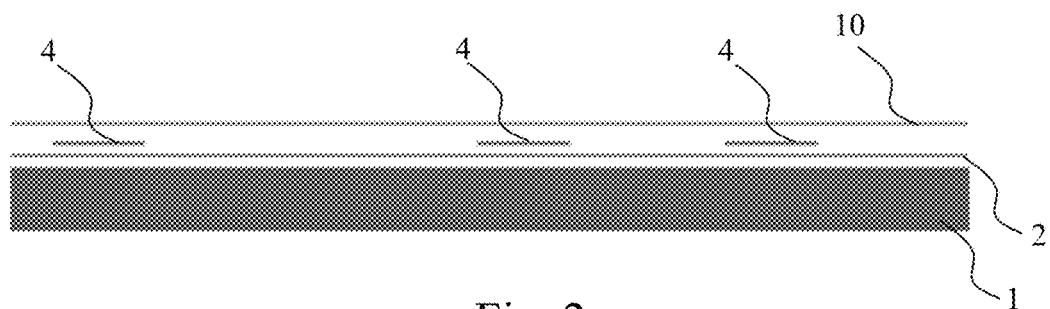
FIG. 2 schematically illustrates another step of the method for assembling the structural panel.
Figure 3:
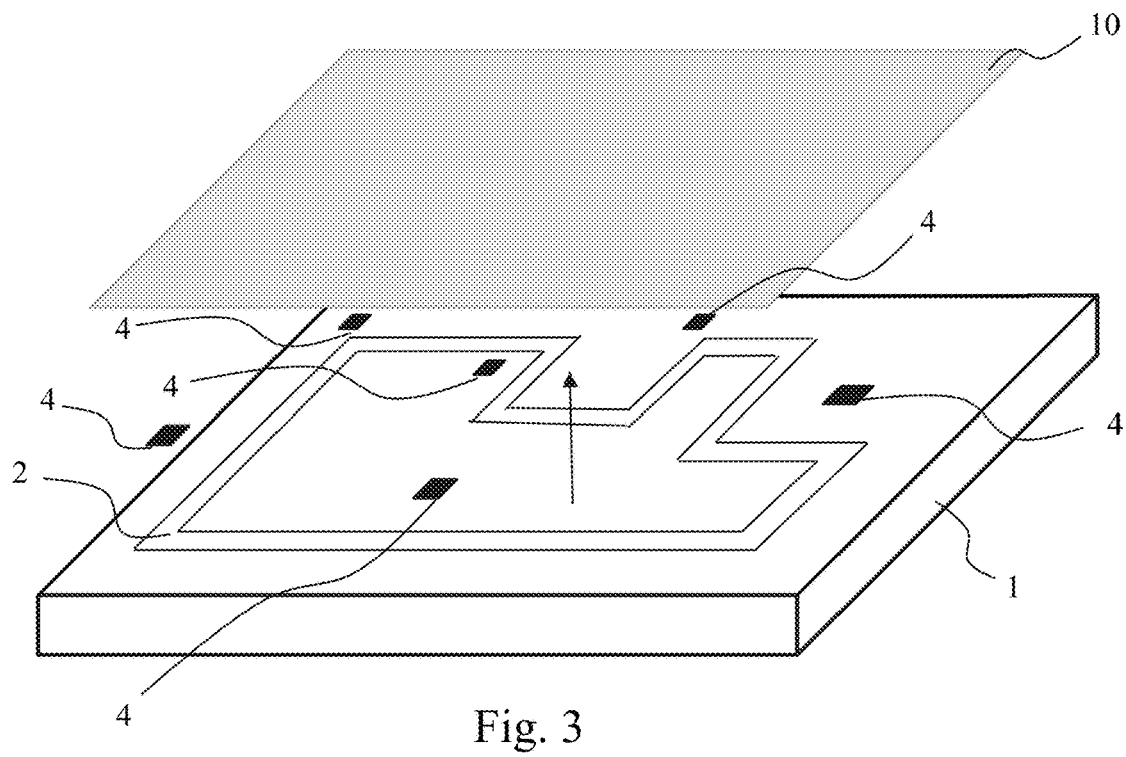
FIG. 3 schematically illustrates yet another step of the method for assembling the structural panel.

FIGS. 1 and 2 show the stack of layers of structural panel 1, metallic track 2, masking strips 4 and wet peel ply 10 comprising the resin film 6, the layers being obtained after the deposition of the wet peel ply 10 comprising the resin film 6. In other words, the metallic track 2 is positioned on the structural panel 1. The masking strips 4 are positioned on the regions 8 of the metallic track 2. Lastly, the wet peel ply 10 comprising the resin film 6 covers the masking strips 4, the metallic track 2 and the structural panel.

According to a particular provision, the method then comprises a step of heating (step 210) the structural panel 1, the conductive metallic track 2 and the wet peel ply 10 so as to thermally bond the resin film 6 to the conductive metallic track 2 and the face of the structural panel 1. Typically, the heating can be carried out in a furnace. The objective of the heating step (step 210) is to thermally bond the resin film 6 such that it adheres to the structural panel 1 and to the metallic track 2, while covering them in a uniform manner, thus making it possible to hold the conductive metallic track 2 against the structural panel 1. According to a particular provision, the heating cures the structural panel 1 made of composite material.

Figure 4:
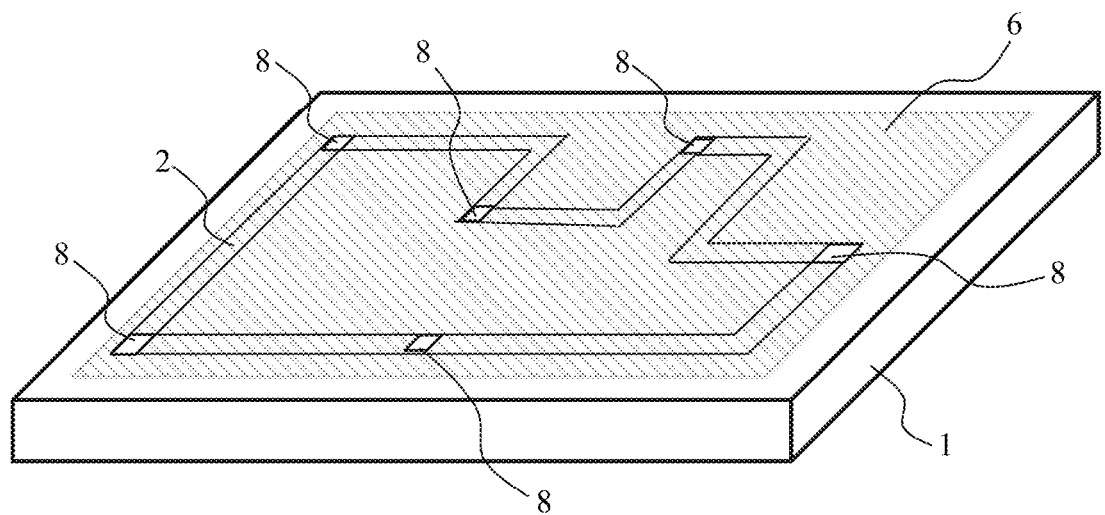
FIG. 4 schematically illustrates yet another step of a method for assembling the structural panel.

After the heating step (step 210), as depicted in FIG. 4, the wet peel ply 10 is removed 212, leaving the thermally bonded (cured) resin film 6 on the structural panel 1, the metallic track 2 and the masking strips 4.

If the structural panel 1 is in the course of lay-up, the heating step 210 polymerizes the resin film 6 and the structural panel 1.

Then, as depicted in FIG. 4, the masking strips 4 are removed (step 214). The regions 8 of the conductive metallic track 2 which were under the masking strips 4 do not have the resin film 6, thus making it possible to establish an electrical connection by contact on these regions 8.

According to a particular provision, it is possible to assemble (step 216) several structural panels 1 and then electrically connect by contact (step 218) the regions 8 of these structural panels 1 so as to form an electrical circuit. These two last assembly steps (steps 216 and 218) are incorporated in the context of a method for assembling the aircraft 100.

While at least one exemplary embodiment of the present invention(s) is disclosed herein, it should be understood that modifications, substitutions and alternatives may be apparent to one of ordinary skill in the art and can be made without departing from the scope of this disclosure. This disclosure is intended to cover any adaptations or variations of the exemplary embodiment(s). In addition, in this disclosure, the terms "comprise" or "comprising" do not exclude other elements or steps, the terms "a" or "one" do not exclude a plural number, and the term "or" means either or both. Furthermore, characteristics or steps which have been described may also be used in combination with other characteristics or steps and in any order unless the disclosure or context suggests otherwise. This disclosure hereby incorporates by reference the complete disclosure of any patent or application from which it claims benefit or priority.

The invention claimed is:

1. A structural panel of an aircraft comprising:
   a conductive metallic track positioned against a face of the structural panel,
   a resin film configured to hold the conductive metallic track against the structural panel,
   wherein the resin film partially covers the conductive metallic track, such that the conductive metallic track has at least one region which does not have the resin film, in order to allow an electrical connection by contact.

2. An aircraft comprising:
   at least one structural panel of an aircraft comprising:
      a conductive metallic track positioned against a face of the structural panel,
      a resin film partially covering the conductive metallic track and the face of the structural panel so as to hold the conductive metallic track against the structural panel,
   wherein the conductive metallic track has at least one region which does not have the resin film, in order to allow an electrical connection by contact.

3. The aircraft according to claim 2, wherein the structural panel is made of composite material.

4. A method for assembling a structural panel of an aircraft, comprising at least the following steps:
   cutting a conductive metallic track from a plate made of conductive metallic material;
   applying a resin film against the conductive metallic track to partially cover the conductive metallic track, so as to leave at least one region which does not have resin film; and
   positioning the conductive metallic track and the resin film against a face of the structural panel, such that the resin film at least partially covers the face of the structural panel, so as to hold the metallic track against the structural panel.

5. The method according to claim 4, further comprising the following step:
   masking at least one region of the conductive metallic track with a masking strip covering each predetermined region, and
   wherein the resin film is applied to the conductive metallic track and to each masking strip.

6. The method according to claim 5, comprising the following step:
   removing each masking strip covered with the resin film, after the resin film and the metallic track have been positioned.

7. The method according to claim 4, wherein the resin film is applied with a wet peel ply.

8. The method according to claim 7, wherein the resin film and the metallic track are positioned in the following manner:
- positioning the wet peel ply with the conductive metallic track on the face of the structural panel;
- heating the structural panel, the conductive metallic track and the wet peel ply so as to thermally bond the resin film to the conductive metallic track and the face of the structural panel; and
- removing the wet peel ply so as to retain the thermally bonded resin film on the conductive metallic track and the face of the structural panel.

9. The method according to claim 8, wherein the structural panel is made of composite material and the heating of the structural panel cures the composite material of the structural panel.

10. A method for assembling an aircraft comprising a phase of assembling several structural panels according to claim 1, comprising the following step:
- electrically connecting by contact each region of the structural panels, so as to form an electricity circulation network.

* * * * *